US006680528B2

(12) United States Patent
Matsuo et al.

(10) Patent No.: US 6,680,528 B2
(45) Date of Patent: Jan. 20, 2004

(54) ELECTRONIC COMPONENT AND ELECTRONIC EQUIPMENT USING THE SAME

(75) Inventors: Satoshi Matsuo, Kyoto (JP); Kunihiro Fujii, Osaka (JP); Takafumi Koga, Osaka (JP); Kozo Murakami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/897,423

(22) Filed: Jul. 3, 2001

(65) Prior Publication Data

US 2002/0024130 A1 Feb. 28, 2002

(51) Int. Cl.$^7$ ............................................... H01L 23/12
(52) U.S. Cl. .................. 257/700; 257/704; 257/710; 257/730
(58) Field of Search ........................ 257/704, 710, 257/730, 700, 703, 705, 706, 707, 709, 731, 711; 438/125

(56) References Cited

U.S. PATENT DOCUMENTS

| | | | | | |
|---|---|---|---|---|---|
| 2,971,138 A | * | 2/1961 | Meisel et al. | ................ | 257/693 |
| 3,736,474 A | * | 5/1973 | Sias | ..................... | 257/692 |
| 4,396,935 A | * | 8/1983 | Schuck | .................... | 257/706 |
| 4,857,988 A | * | 8/1989 | Fottler | .................... | 257/693 |
| 5,142,352 A | * | 8/1992 | Chambers et al. | .......... | 257/704 |
| 5,635,670 A | * | 6/1997 | Kubota et al. | ............ | 174/52.1 |
| 6,144,090 A | * | 11/2000 | Higashiguchi | .............. | 257/693 |
| 6,303,974 B1 | * | 10/2001 | Irons et al. | .................. | 257/584 |

FOREIGN PATENT DOCUMENTS

| | | |
|---|---|---|
| EP | 0526103 A2 | 2/1993 |
| EP | 0633685 A2 | 1/1995 |
| EP | 1056264 A2 | 11/2000 |
| EP | 1122937 A2 | 8/2001 |
| JP | 5-275552 | 10/1993 |
| JP | 8-115990 | 5/1996 |
| JP | 8-125049 | 5/1996 |
| JP | 9-186547 | 7/1997 |
| JP | 2000-228451 | 8/2000 |

* cited by examiner

Primary Examiner—Tom Thomas
Assistant Examiner—Douglas W. Owens
(74) Attorney, Agent, or Firm—McDermott, Will & Emery

(57) ABSTRACT

An electronic component having recesses on side faces of its package for housing an electric element therein. A metal layer that does not reach the bottom end of the package is formed on the surface of the recess. The metal layer has excellent wettability to a brazing material and helps extra material flow into the recess easily. In addition, the interface between the top end face of the recess and the side face is curved to make the brazing material flow into the recess easily. When the opening of the package is sealed with a lid using the brazing material, the extra brazing material flows into the recess. This prevents the brazing material from protruding outside of the package and thus improves dimensional accuracy of the electronic component. Therefore, mounting accuracy of the electronic component can be improved and short circuit can be prevented.

27 Claims, 5 Drawing Sheets

ELECTRONIC COMPONENT AND ELECTRONIC EQUIPMENT USING THE SAME

FIELD OF THE INVENTION

The present invention relates to an electronic component having an electric element sealed in a package, such as a SAW device, and electronic equipment having such an electronic component mounted on a substrate.

BACKGROUND OF THE INVENTION

FIG. 7 is a top view of a conventional surface acoustic wave device (hereinafter referred to as a SAW device) and FIG. 8 is a side view thereof.

In a conventional SAW device, a surface acoustic wave element (hereinafter referred to as a SAW element) having an inter-digital transducer (hereinafter referred to as an IDT) formed on a piezoelectric substrate is housed in package 100 and an opening of package 100 is sealed with lid 102 using brazing material 101.

With a device of the above-mentioned structure, brazing material 101 sometimes protrudes on the periphery of package 100 when the opening of package 100 is sealed with lid 102.

When lid 102 is fixed to the opening of package 100, brazing material 101 provided between package 100 and lid 102 is heated and pressed from the top face of lid 102. The pressure protrudes brazing material 101 on a periphery of package 100 and forms ball-like clot 103. The ball-like clot 103 causes a deviation in the outside dimension of the SAW device, and hinders accurate mounting of the device onto a circuit board. In addition, such a clot poses another problem: falling of ball-like clot 103 may cause short circuits between neighboring electrode patterns or other components mounted.

It is an object of the present invention to provide an electronic component that has improved mounting accuracy and develops no short circuits on the circuit board. The component is provided with recesses for receiving surplus brazing material so that no brazing material protrudes on the periphery of the package when the opening of the package is sealed with the lid.

SUMMARY OF THE INVENTION

The electronic component in accordance with the present invention has recesses on side faces of its package for housing an electric element, in the direction from the top end to the bottom end of the package. On a surface of the recess, a metal layer that does not reach the bottom end of the package is formed. The metal layer has excellent wettability to a brazing material and helps the surplus brazing material flow into the recess easily. In addition, an interface between the top end face of the recess and the side face continues via a curved surface so that the brazing material easily flows into the recess.

With the structure in accordance with the present invention, the surplus brazing material flows into the recess when the opening of the package is sealed with a lid using the brazing material. This prevents the brazing material from protruding outside of the package and improves dimensional accuracy of the electronic component. Therefore, mounting accuracy of the electronic component can be improved and short circuits occurred in mounting the electronic component onto a substrate can be prevented. In addition, the recess having a curved cross sectional shape prevents the deterioration of the package strength.

Moreover, making the dimension of the lid smaller than that of the package prevents the brazing material from protruding outside of the package.

The electronic equipment in accordance with the present invention has the electronic component of the present invention mounted on a circuit board.

DESCRIPTION OF THE PREFERRED EMBODIMENTS

Figure 1:
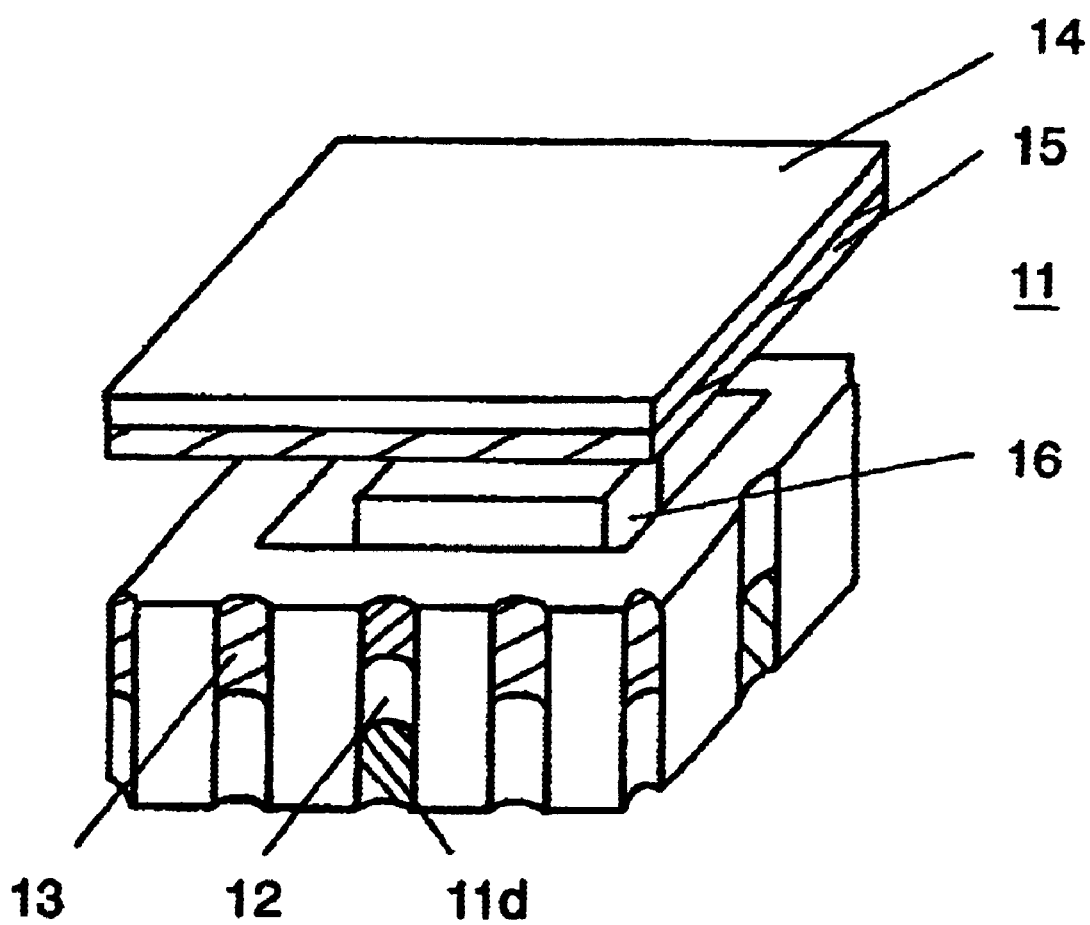
FIG. 1 is an exploded perspective view of a SAW device in accordance with an exemplary embodiment of the present invention.
Figure 2:
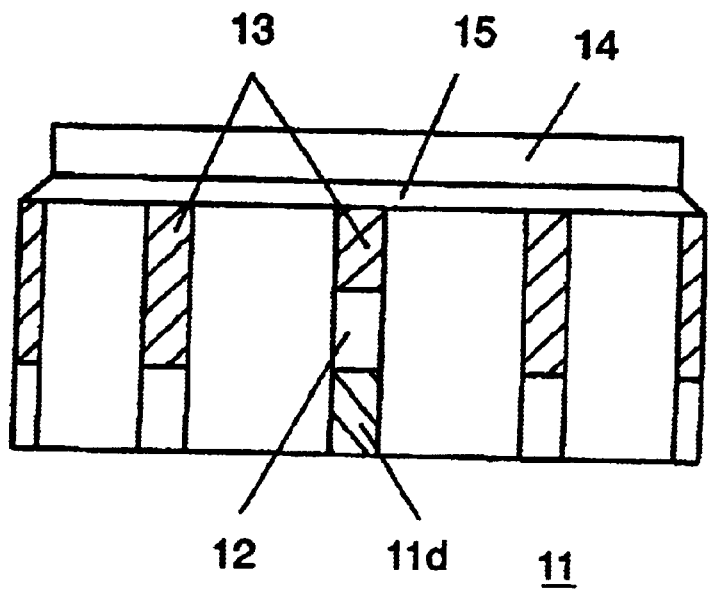
FIG. 2 is a side view of the SAW device.
Figure 3:
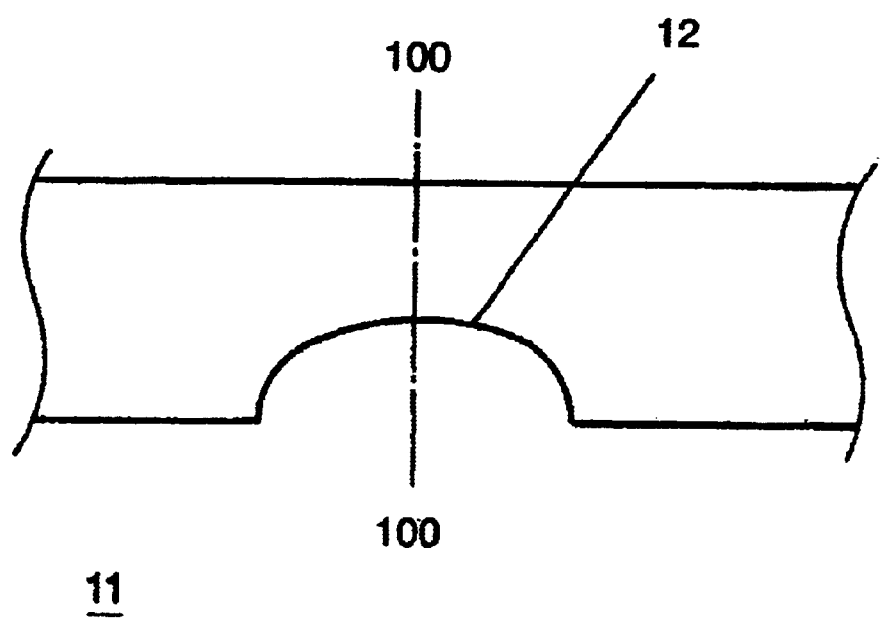
FIG. 3 is an enlarged top view of a particular part of a package shown in FIG. 1
Figure 4:
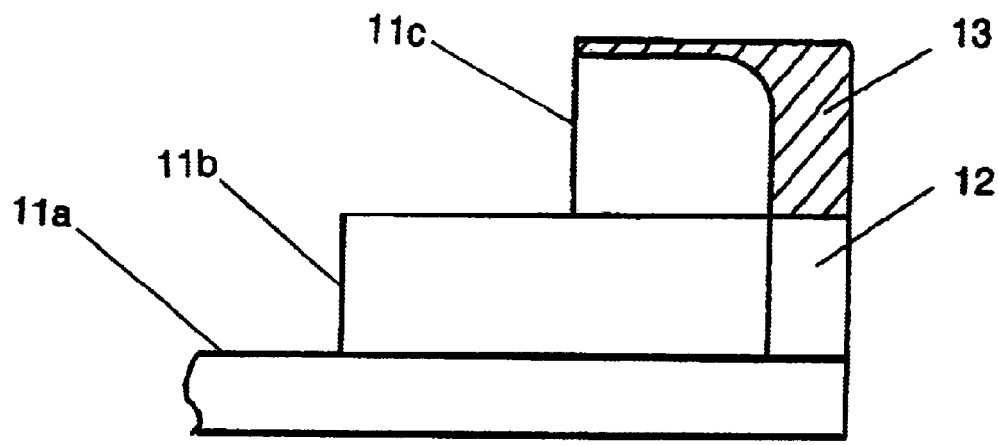
FIG. 4 is a cross sectional view taken on line 100—100 of FIG. 3.
Figure 5:
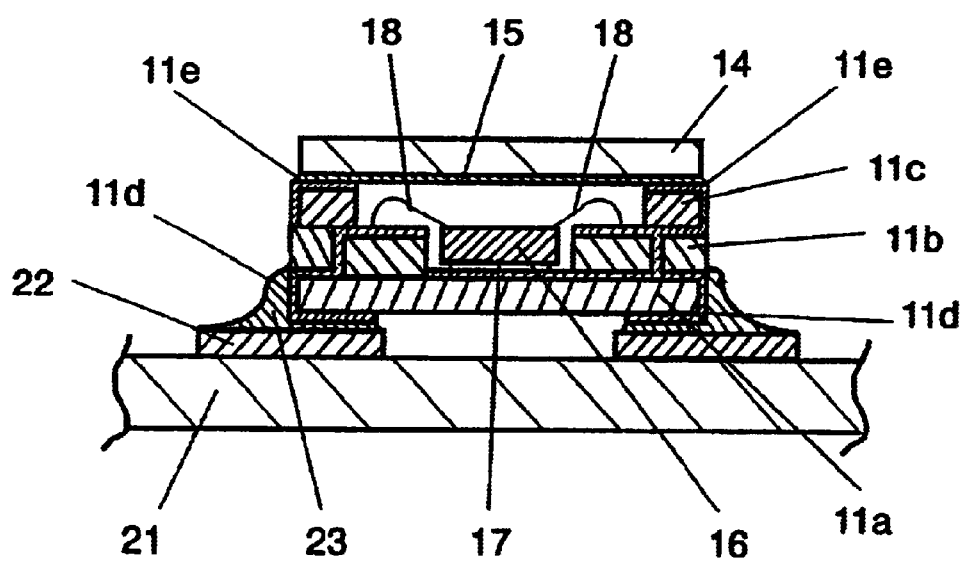
FIG. 5 is a partially enlarged sectional view of electronic equipment having an electronic component in accordance with a first exemplary embodiment of the present invention mounted thereon.

Exemplary embodiments in accordance with the present invention are hereinafter described with reference to the accompanying drawings using a SAW device as an example.
First Embodiment FIG. 1 is an exploded perspective view of a SAW device in accordance with a first exemplary embodiment of the present invention. FIG. 2 is a side view of the SAW device shown in FIG. 1. FIG. 3 is an enlarged top view of a particular part of a package for use in the SAW device shown in FIG. 1. FIG. 4 is a cross sectional view taken on line 100—100 of FIG. 3. FIG. 5 is a cross sectional view of electronic equipment having the SAW device of FIG. 1 mounted on a circuit board.

In FIG. 5, ceramic substrate 11*a*, first ceramic frame 11*b* and second ceramic frame 11*c* are integrated into package 11. As shown in FIG. 4, the part from the top end of package 11 to the side face of package 11 is curved. Package 11 also has connecting electrodes 11*d* formed from the inside of package 11 to the outer surface thereof and metal layer 11*e* provided on the top end face thereof.

The peripheral side faces of package 11 have a plurality of recesses 12 from the top end to the bottom end thereof. As shown in FIG. 3, the horizontal section of recess 12 is curved. Recess 12 is larger on the top end side of package 11 than on the bottom end side thereof. In addition, as shown in FIG. 4, recess 12 continues to the top end face of package 11 via a curved surface.

Some of recesses 12 have metal layers 13. Metal layers 13 extend to the top end of package 11 and have a predetermined space from the bottom end thereof.

Lid 14 is formed of an iron-nickel-cobalt alloy, and the like.

Solder layer 15 as a brazing material is formed over the whole area of one side of lid 14.

SAW element 16 is made by forming an IDT, reflector, and the like on a piezoelectric substrate.

Adhesive material 17 fixes SAW element 16 onto the bottom of package 11 inside thereof.

Wires 18 connect SAW element 16 and connecting electrodes 11d.

Circuit board 21 has circuits on the surface and inside thereof and is used for mounting various electronic components, including a SAW device. Lands 22 are provided for mounting electronic components on circuit board 21. Solders 23 fix the SAW device onto lands 22. Solders 23 have a composition different from that of solder layer 15.

The method of manufacturing a SAW device structured as above and electronic equipment using the device is described below.

Firstly, plating undercoat layers of a shape the same as that of desired connecting electrodes 11d are formed on the front and back faces of aluminum oxide-based ceramic substrate 11a. The base material of the undercoat layer is tungsten.

Secondly, first ceramic frame 11b is stacked on substrate 11a and second ceramic frame 11c is stacked on the first ceramic frame. Then substrate 11a, first and second frames 11b and 11c are co-fired to provide integrated package 11. Tungsten is also fired in this firing step. First and second frames 11b and 11c are made of a material the same as that of substrate 11a. Plating undercoat layers are formed on the areas to be connecting electrodes 11d, metal layers 11e and 13. The metal used for the undercoat layer is not limited to tungsten on condition that it can be co-fired with substrate 11a and first and second frames 11b and 11c.

Thirdly, a plurality of recesses 12 are formed on the side faces of substrate 11a and frames 11b and 11c so that the recesses are formed on the side faces of package 11 in the direction from a top end to a bottom end thereof. Moreover, tungsten-based plating undercoat layers are formed on the surfaces of some of recesses 12 and top end face of package 11.

Among the plating undercoat layers on recesses 12, those connecting to the undercoat layer of the top end face of package 11 (to be metal layers 13) are formed so as to have a predetermined space from the bottom end of package 11. The undercoat layer on recesses 12 connecting to that of the bottom face of package 11 (to be part of connecting electrodes 11d) are formed so as to have a predetermined space from the top end of package 11.

The undercoat layers are formed by applying tungsten-based paste to predetermined positions of substrate 11a and first and second frames 11b and 11c and firing it in the step of firing substrate 11a and first and second frames 11b and 11c. Therefore, the metal is not limited to tungsten on condition that it can be co-fired with substrate 11a and first and second frames 11b and 11c.

Fourthly, nickel plating layers are formed over these undercoat layers on package 11 and gold plating layers are formed over the nickel layers to obtain connecting electrodes 11d, metal layer 11e on the top end face of package 11 and metal layers 13 on the surfaces of recesses 12. Connecting electrodes 11d and metal layers 13 are not in contact with each other.

Thereafter, SAW element 16 having an IDT and reflector using aluminum or an aluminum alloy, and the like, formed on a piezoelectric substrate is bonded to the inside of package 11 using adhesive material 17, and SAW element 16 and connecting electrodes 11d are electrically connected via wires 18.

Fifthly, in order to seal the opening of package 11 with metal lid 14 that has solder layer 15 of high-temperature solder on one side thereof, lid 14 and package 11 are aligned with solder layer 15 on lid 14 placed on the side of package 11.

Thereafter, package 11 is sealed with lid 14 by heating and pressing solder layer 15 from the top face of lid 14 in a non-oxidizing atmosphere so as to melt the solder layer, and a SAW device shown in FIGS. 1 and 2 is obtained.

At this time, the entire lid 14 should be pressed sufficiently. This is because the oxide film formed over the surface of solder layer 15 must be destroyed to improve the intimate contact between lid 14 and package 11.

Heat applied during sealing expands the gas inside of package 11, increases the internal pressure thereof, and exerts force that elevates lid 14 upwardly. The pressing of the lid must suppress this force.

Generally, when two elements are bonded by soldering, a flux is used to destroy the oxide film formed over the solder so as to facilitate bonding. Thus, in order to seal the opening of package 11 easily and tightly, application of a flux to the opening is desirable. However, the flux contains a material that erodes aluminum, which constitutes the electrodes of SAW element 6. Therefore, entry of a flux together with the solder into package 11 erodes the electrodes including an IDT, and deteriorates the characteristics of the SAW device. For this reason, a flux cannot be used in a SAW device.

When a flux cannot be used and the side faces do not have any recesses like a conventional package, in order to tightly seal the opening of the package with a lid of a size of 5 mm$^2$, for example, a pressure of 2 to 3 grams force must be applied to the center of the lid so as to equally press the entire lid. When only little pressure is applied, that is, only small loads are applied or insufficient loads are applied to part to be sealed because the pressure is not applied to the center of lid 14, the solder is in insufficient contact with the opening of package 11 and thus package 11 cannot be sealed tightly.

In contrast, when too much pressure is applied to the lid, the solder is pushed out from package 11 and this causes a deviation in the outside dimension of the SAW device.

However, recesses 12 for receiving solder that are provided on the side faces of package 11 in accordance with the present invention can receive surplus solder even when a pressure of 500 gram force is applied to lid 14 of a size of 5 mm$^2$, for example. Thus, package 11 can be sealed tightly and deviation in the outside dimension can be reduced.

Lastly, the SAW device is fixed onto lands 22 using solder 23 and an electronic component shown in FIG. 5 is obtained.

As described above, in accordance with the present invention, the surplus solder flows into recesses 12 having metal layers 13 that are provided on package 11, when package 11 is sealed with lid 14. Thus, the solder does not protrude in a ball shape outside of package 11 and almost no deviation in the outside dimension of the SAW device is seen.

Moreover, with the electronic component in accordance with the present invention, since metal layers 13 are formed so as to have a predetermined space from the bottom end of package 11, solder 23 is prevented from mixing with the solder in solder layer 15 via metal layer 13 when the component is mounted on circuit board 21. For example, when solder layer 15 is formed of a high-temperature solder and solder 23 is a Bi containing lead-free solder, electrical disconnection or deterioration of sealing of the package caused by cracks, which is a result of the mixing of these solders, can be prevented.

In this embodiment, recess 12 is larger on the top end side of package 11 than on the bottom end side thereof, the interface between recess 12 and the top end face of package 11 is curved, or metal layer 13 is formed of a metal having excellent wettability to the solder. This makes the surplus solder flow into recesses 12 easily when package 11 is sealed. In the use of a brazing material other than solder, it is desirable to provide metal layers 13 having high wettability to the brazing material, on the surfaces of recesses 12.

In addition, as is shown in FIGS. 2 and 5, the size of lid 14 smaller than the size of package 11 makes a space for receiving the surplus solder larger, and thus the surplus solder is effectively prevented from protruding outside of package 11.

Furthermore, the curved cross sectional shape of recess 12 as shown in FIG. 3 can minimize the deterioration of the strength of package 11 caused by the formation of recesses 12.

When two recesses 12 are provided on package 11, they are placed on opposite side faces thereof. When three or more recesses are provided, they are distributed on each side face of package 11. Thus, each of recesses 12 can receive the solder equally, prevent inclination of lid 14, and provide stable sealing.

In contrast, when surplus solder flow into recesses 12 of a completed SAW device is not found, the solder may not have molten sufficiently. Such a case is regarded as sealing abnormality with inappropriate sealing conditions. Therefore, an observation of recesses 12 is also useful for inspecting a sealing condition. Especially, with the above-mentioned embodiment, the surface of metal layer 13 is golden as it is gold-plated and the solder flowing into the recesses is silver; thus a flow of the solder can easily be observed. In this manner, it is effective to check how the solder flows into recesses 12 as a means for sealing check.

In accordance with this embodiment, recesses 12 are made larger on the top end side of package 11 than on the bottom end side thereof. This shape can receive a larger quantity of surplus solder.

Second embodiment

Figure 6:
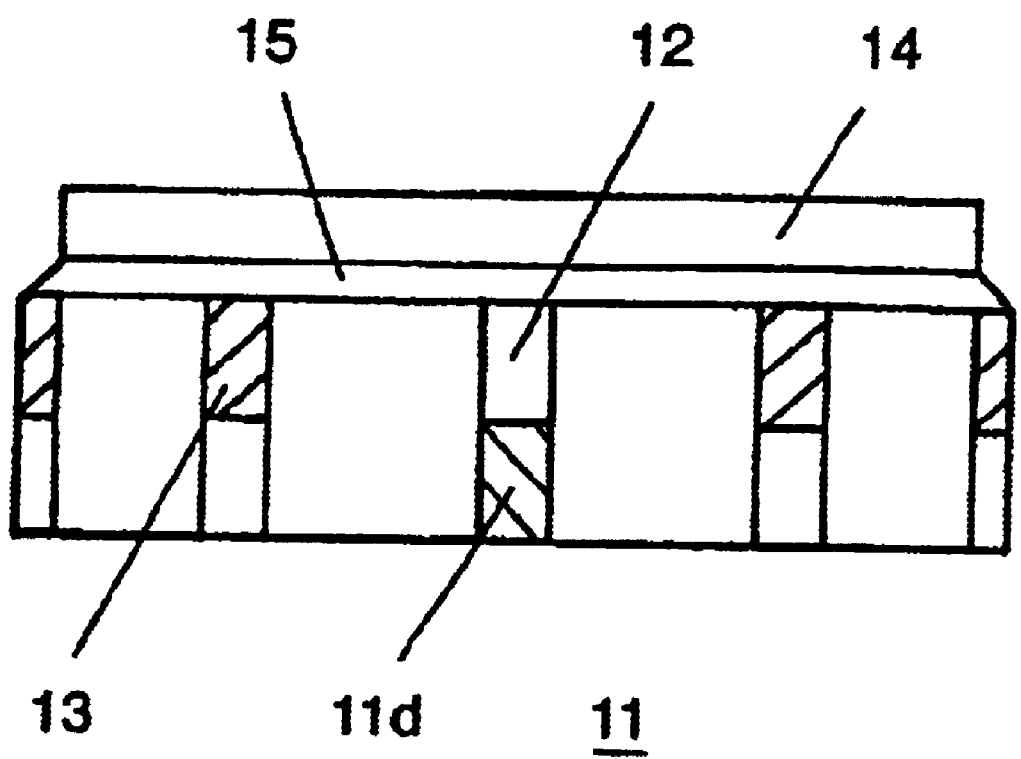
FIG. 6 is a side view of a SAW device in accordance with a second exemplary embodiment of the present invention.
Figure 7:
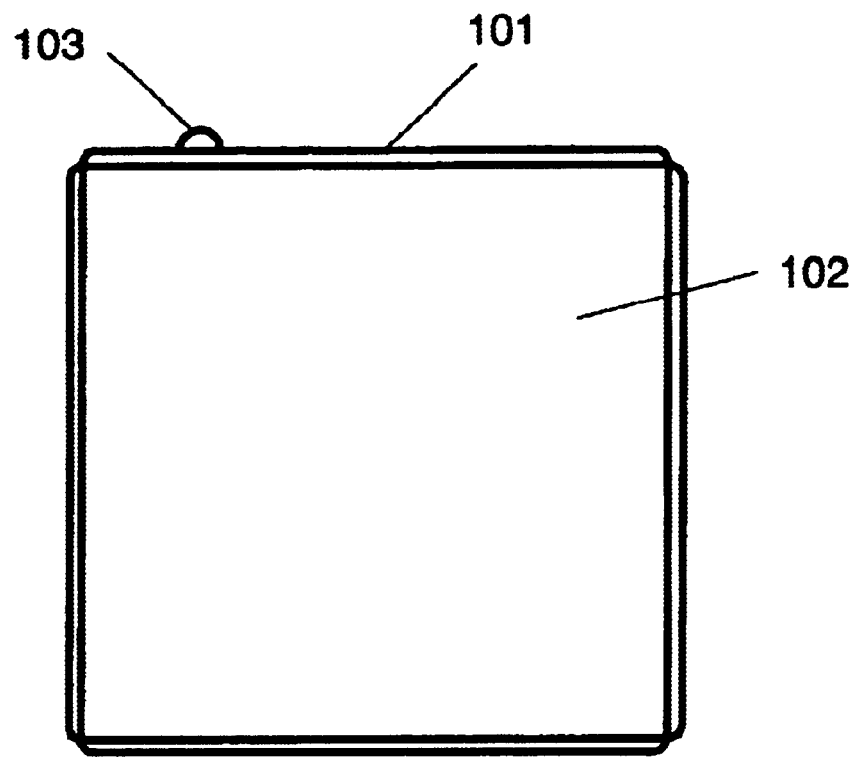
FIG. 7 is a top view of a conventional SAW device.
Figure 8:
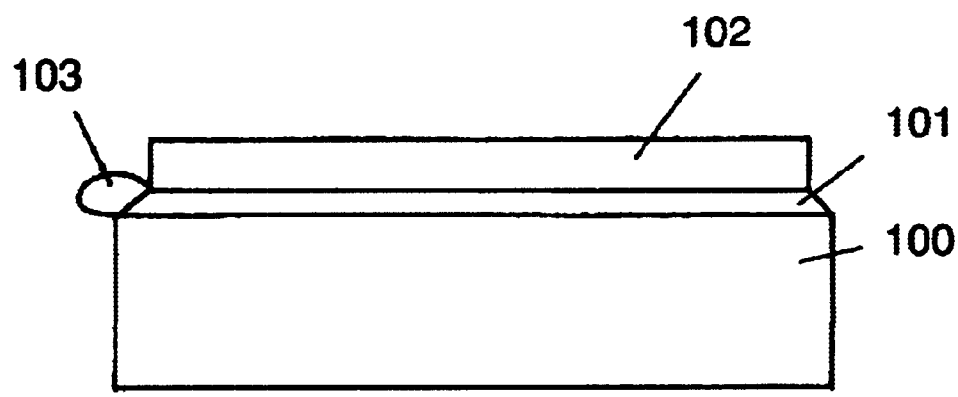
FIG. 8 is a side view of the conventional SAW device.

FIG. 6 is a side view of a SAW device in accordance with a second exemplary embodiment of the present invention. In FIG. 6, the same elements used in the SAW device of FIG. 1 are denoted with the same reference numerals.

In this embodiment, the difference from the first embodiment is that one ceramic frame is stacked on a ceramic substrate to form package 11.

In the first and second embodiments, the lengths of recess 12 and metal layer 13 are determined by the heights of the ceramic frames. Therefore, recess 12 and metal layer 13 having desired lengths can be obtained by combining a desired number of ceramic frames of predetermined heights.

In this embodiment, recesses 12 are formed so as to extend to the bottom end of package 11. However, forming recesses 12 that do not reach the bottom end of package 11 can further prevents short circuits occurred by a brazing material that has flowed into recess 12.

In the above embodiments, a SAW device has been described as an example of electronic components. However, the present invention is not limited to SAW devices. In other words, any type of electronic component in which an electric element is housed in a package and the opening thereof is sealed with a lid using a brazing material has the effects similar to those of the present invention.

As mentioned above, the present invention can provide an electronic component capable of preventing short circuits on a circuit board during or after its mounting thereon. In addition, the electronic component in accordance with the present invention has excellent dimensional accuracy and can be mounted onto a circuit board accurately because it has no protrusion on the periphery of the package thereof.

What is claimed is:

1. An electronic component comprising:

a package having an opening;

an electric element housed in said package;

a lid for sealing the opening of said package; and at least one recess formed on an outer peripheral surface of said package; and a metal layer formed on said recess and not reaching a bottom end of said package.

2. The electronic component as set forth in claim 1, further comprising a brazing material positioned between said package and said lid, wherein said package and said lid are sealed with said brazing material.

3. The electronic component as set forth in claim 2 wherein said metal layer is made of a metal having excellent wettability to said brazing material.

4. The electronic component as set forth in claim 1 wherein said recess continues to a top end face of said package via a curved surface.

5. The electronic component as set forth in claim 1 wherein a cross sectional shape of said recess is curved.

6. The electronic component as set forth in claim 1 wherein at least two recesses are formed on opposite side faces of said package.

7. The electronic component as set forth in claim 1 wherein an outside dimension of said lid is smaller than that of said package.

8. The electronic component as set forth in claim 1 wherein said electric element is a surface acoustic wave element.

9. The electronic component as set forth in claim 1, wherein at least a portion of said at least one recess is positioned on the side of said lid which includes said bottom end of said package.

10. The electronic component as set forth in claim 1, wherein said at least one recess is a plurality of recesses, said plurality of recesses being formed in a direction from a top end to a bottom end of said package.

11. Electronic equipment comprising a circuit board having an electrode on a surface thereof, and an electronic component mounted on said electrode, said electronic component comprising:

a package having an opening;

an electric element housed in said package;

a lid for sealing the opening of said package;

at least one recess formed on a side face of said package; and a metal layer formed on said recess and not reaching a bottom end of said package.

12. The electronic equipment as set forth in claim 11 wherein said package and said lid are sealed with a brazing material, said brazing material having a composition different from that of a second brazing material connecting said electronic component to said circuit board.

13. The electronic component as set forth in claim 11, wherein said at least one recess is a plurality of recesses, said plurality of recesses being formed in a direction from a top end to a bottom end of said package.

14. A package for housing an electric element, comprising:

a body having a top surface, bottom surface, and a peripheral surface between said top surface and bottom surface, said body adapted to house an electric element therein;

at least one recess located on said peripheral surface, said at least one recess extending from said top surface, and a metal layer formed on said at least one recess and not reaching a bottom end of said package.

15. The package of claim 14, wherein said at least one recess extends to said bottom surface.

16. The package of claim 14, wherein said at least one recess terminates at a location between said top surface and said bottom surface.

17. The package of claim 14, further including a lid adapted to be sealably coupled to said top surface.

18. The package of claim 17, wherein said lid includes a lower surface with a brazing material thereon.

19. The package of claim 18, wherein said metal layer is selected to have wettability to the brazing material.

20. The package of claim 19, wherein said metal layer is gold and said brazing material is solder.

21. The package of claim 18, wherein said metal layer is a different color than the brazing material.

22. The package of claim 17, wherein said lid is positioned within the periphery of the top surface.

23. The package of claim 14, wherein said at least one recess extends from said top surface along a curved surface.

24. The package of claim 14, wherein said at least one recess defines a curve.

25. The package of claim 14, wherein said at least one recess includes a plurality of recesses, said plurality of recesses being equally spaced about said peripheral surface.

26. A package for housing an electric element, comprising:

a body having a top surface, bottom surface, and a peripheral surface between said top surface and bottom surface, said body adapted to house an electric element therein; and at least one recess located on said peripheral surface, said at least one recess extending from said top surface, wherein a size of said at least one recess decreases extending away from said top surface.

27. A package for housing an electric element, comprising:

a body having a top surface, bottom surface, and a peripheral surface between said top surface and bottom surface, said body adapted to house an electric element therein; and at least one recess located on said peripheral surface, said at least one recess extending from said top surface, said package further including a lid adapted to be sealably coupled to said top surface, wherein said lid includes a lower surface with a brazing material thereon, wherein at least one of said at least one recess is coated with a metal layer, said metal layer selected to have wettability to the brazing material, wherein said at least one of said at least one recess extends to said bottom surface, said metal layer extending from said top surface and terminating at a location between said top surface and said bottom surface.

* * * * *